US009621193B1

(12) United States Patent
Bentley et al.

(10) Patent No.: US 9,621,193 B1
(45) Date of Patent: Apr. 11, 2017

(54) MICROCODE DATA RECOVERY STRATEGIES FOR USE OF ITERATIVE DECODE

(71) Applicant: INTERNATIONAL BUSINESS MACHINES CORPORATION, Armonk, NY (US)

(72) Inventors: Steven R. Bentley, Tucson, AZ (US); Pamela R. Nylander-Hill, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/987,921

(22) Filed: Jan. 5, 2016

(51) Int. Cl.
*H03M 13/37* (2006.01)
*G06F 11/10* (2006.01)
*H03M 13/00* (2006.01)

(52) U.S. Cl.
CPC ......... *H03M 13/3746* (2013.01); *G06F 11/10* (2013.01); *H03M 13/611* (2013.01)

(58) Field of Classification Search
CPC .................................................. G11B 20/1833
USPC ........................... 714/771, 755, 784, 763, 56
See application file for complete search history.

(56) References Cited

U.S. PATENT DOCUMENTS

| | | | |
|---|---|---|---|
| 5,490,149 A * | 2/1996 | Nylander-Hill | G06F 3/0601 360/53 |
| 5,566,298 A | 10/1996 | Boggs et al. | |
| 5,715,193 A | 2/1998 | Norman | |
| 6,877,128 B2 | 4/2005 | Boyer et al. | |
| 7,266,750 B1 | 9/2007 | Patapoutian et al. | |
| 7,280,293 B2 * | 10/2007 | Nylander-Hill | G11B 20/1879 360/31 |
| 7,322,003 B2 | 1/2008 | Ishii | |
| 7,437,651 B2 | 10/2008 | Nerl et al. | |
| 7,610,544 B2 | 10/2009 | Guo | |
| 7,900,125 B1 | 3/2011 | Liu et al. | |
| 8,032,812 B1 | 10/2011 | Yang et al. | |
| 8,069,151 B1 * | 11/2011 | Crafford | G06F 11/1469 707/674 |
| 8,612,797 B2 | 12/2013 | Thayer et al. | |
| 8,810,944 B1 * | 8/2014 | Katagiri | G11B 20/1886 360/53 |
| 8,832,524 B2 | 9/2014 | Bennett | |
| 8,996,952 B2 | 3/2015 | Li et al. | |
| 9,141,478 B2 * | 9/2015 | Katagiri | G06F 11/1076 |
| 9,230,595 B2 | 1/2016 | Hasegawa et al. | |
| 2004/0054953 A1 * | 3/2004 | Mitchell | G06F 12/0875 714/748 |
| 2008/0178058 A1 | 7/2008 | Kuo et al. | |

OTHER PUBLICATIONS

U.S. Appl. No. 14/987,921, filed Jan. 5, 2016.

(Continued)

*Primary Examiner* — Fritz Alphonse
(74) *Attorney, Agent, or Firm* — Griffiths & Seaton PLLC

(57) ABSTRACT

Various embodiments for data error recovery in a tape storage system, by a processor device, are provided. In one embodiment, a method comprises, in a tape storage system using an iterative hardware decoder, dynamically initializing at least one microcode-initiated decode cycle on a buffered dataset, each iterative decode cycle providing an error feedback loop.

24 Claims, 16 Drawing Sheets

(56) References Cited

OTHER PUBLICATIONS

U.S. Appl. No. 14/987,935, filed Jan. 5, 2016.
IBM, "Microcode Intervention for Symptomatic Error Recovery Patterns on Tape Drives," an IP.com Prior Art Database Technical Disclosure, http://ip.com/IPCOM/000174782, Sep. 23, 2008 (2 pages).
List of IBM Patents or Patent Applications Treated as Related dated Mar. 30, 2016 (2 pages).
U.S. Appl. No. 14/987,935, filed Jan. 5, 2016 (54 pages).

* cited by examiner

800B

| SCENARIO: 1 | RESULTS | | | | MICROCODE INTERPRETATION |
|---|---|---|---|---|---|
| ID CYCLE # | C2C BLOCK STATUS | | C1C BLOCK STATUS | | |
| | UE | CORCNT | UE | CORCNT | |
| 1 | 1 | 0 | 1 | 0 | SUB-DATASETS ARE STILL IN ERROR, BUT NO PROGRESS BEING MADE. STOP ITERATIVE DECODE REQUESTS |

800C

| SCENARIO: 2 | RESULTS | | | | MICROCODE INTERPRETATION |
|---|---|---|---|---|---|
| ID CYCLE # | C2C BLOCK STATUS | | C1C BLOCK STATUS | | |
| | UE | CORCNT | UE | CORCNT | |
| 1 | 1 | 500 | 1 | 200 | ECC CORRECTION PROGRESSING, CONTINUE ITERATIVE DECODE |
| 2 | 1 | 120 | 1 | 10 | ECC CORRECTION PROGRESSING, CONTINUE ITERATIVE DECODE |
| 3 | 1 | 120 | 1 | 10 | ECC STALLED, ITERATIVE DECODE* |

* THERE COULD ALSO BE A THRESHOLD DIFFERENCE BETWEEN TWO C2C OR TWO C1C CORCNT VALUES TO MARK CONVERGENCE. CONVERGENCE METRICS WILL VARY, DEPENDING ON DATAFLOW IMPLEMENTATION AND HOW MUCH C2C-C1C STATUS IS MONITORED BY ITERATIVE DECODE MICROCODE CONTROL.

FIG. 8B

| DATAFLOW C1D CORR MODE | 1ST C2C¹ DECODE | 1ST C1C¹ DECODE | 2ND C2C¹ DECODE | 2ND C1C¹ DECODE | 3RD C2C¹ DECODE | 3RD C1C¹ DECODE |
|---|---|---|---|---|---|---|
| ERASURE MODE | USE C1D POINTERS | DON'T USE POINTERS OPTION: USE C2C POINTERS | DON'T USE POINTERS | DON'T USE POINTERS OPTION: USE C2C POINTERS | DON'T USE POINTERS | DON'T USE POINTERS OPTION: USE C2C POINTERS |
| NON_ERASURE MODE (RANDOM) USE DEFAULT ERASURE DECODING FOR SIGNAL DROPOUT DETECTION | DON'T USE C1D POINTERS | DON'T USE POINTERS | DON'T USE POINTERS | DON'T USE POINTERS | DON'T USE POINTERS | DON'T USE POINTERS |

(CYCLE: C2C-C1C)

FIG. 9A

| DATAFLOW C1D CORR MODE | 1ST C2C¹ DECODE | 1ST C1C¹ DECODE | 1ST C2C² DECODE | 2ND C2C¹ DECODE | 2ND C1C¹ DECODE | 2ND C2C² DECODE | 3RD C2C¹ DECODE |
|---|---|---|---|---|---|---|---|
| ERASURE MODE | USE C1D POINTERS | DON'T USE POINTERS OPTION: USE C2C POINTERS | DON'T USE POINTERS | DON'T USE POINTERS OPTION: USE C2C POINTERS | DON'T USE POINTERS OPTION: USE C2C POINTERS | DON'T USE POINTERS | DON'T USE POINTERS |
| NON_ERASURE MODE (RANDOM) USE DEFAULT ERASURE DECODING FOR SIGNAL DROPOUT DETECTION | DON'T USE C1D POINTERS | DON'T USE POINTERS | DON'T USE POINTERS | DON'T USE POINTERS | DON'T USE POINTERS | DON'T USE POINTERS | DON'T USE POINTERS |

(CYCLE: C2C-C1C-C2C)

FIG. 9B

MICROCODE DATA RECOVERY STRATEGIES FOR USE OF ITERATIVE DECODE

BACKGROUND OF THE INVENTION

Field of the Invention

The present invention relates in general to computers, and more particularly to various embodiments for data error recovery in tape storage systems.

Description of the Related Art

In today's society, computer systems are commonplace. Computer systems may be found in the workplace, at home, or at school. Computer systems may include data storage systems, or disk storage systems, to process, store, and archive data. Large data archiving solutions typically use tape library systems where workstations and client devices are connected to one or more servers, and the servers are connected to one or more libraries. In data centers, such as those providing imaging for health care, entertainment, weather, military, and space exploration applications, these servers and libraries are often interconnected in a grid-computing environment.

SUMMARY OF THE DESCRIBED EMBODIMENTS

Various embodiments for data error recovery in a tape storage system, by a processor device, are provided. In one embodiment, a method comprises, in a tape storage system using an iterative hardware decoder, dynamically initializing at least one microcode iterative decode cycle on a buffered dataset, each iterative decode cycle providing an error feedback loop.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which:

FIG. 9A illustrates a table set of exemplary erasure correction configuration settings according to aspects of the present invention;

FIG. 9B illustrates a continuation of the table set of exemplary erasure correction configuration settings shown in FIG. 9A according to aspects of the present invention;

DETAILED DESCRIPTION OF THE DRAWINGS

Figure 1A:
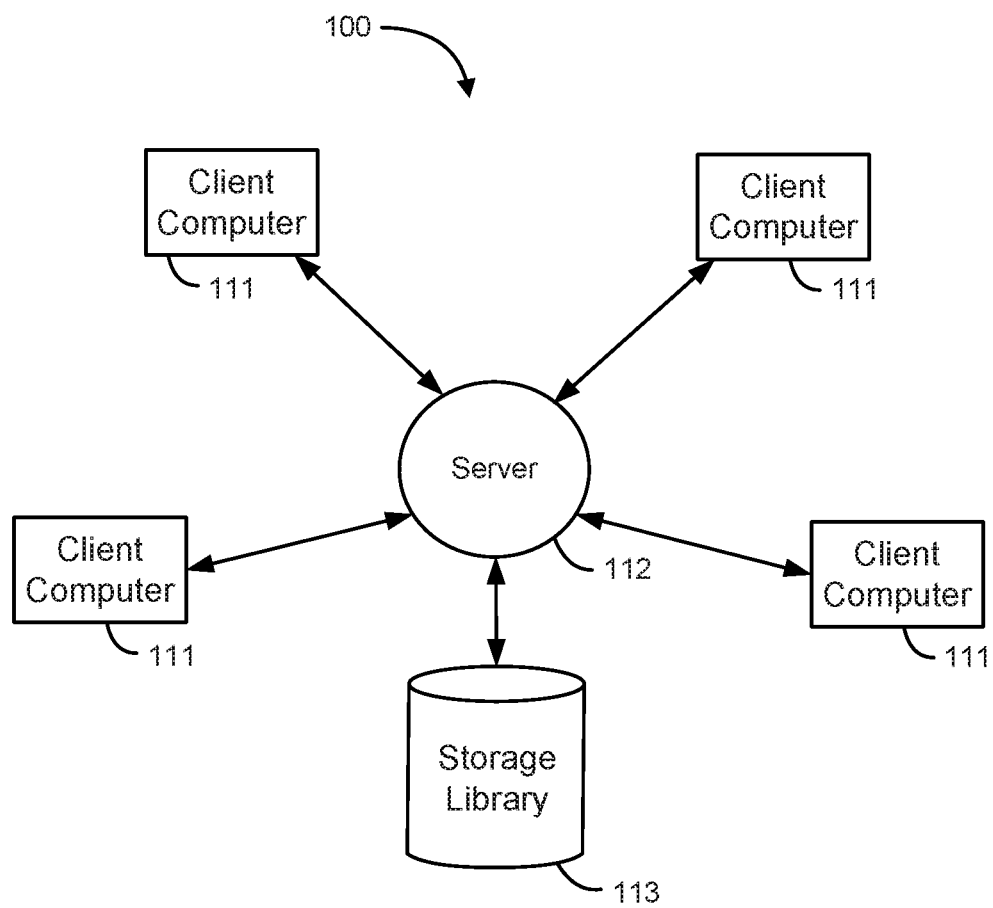
FIG. 1A is a block diagram illustrating a typical client-server library system for archiving data in which aspects of the invention can be implemented.

With increasing demand for faster, more powerful and more efficient ways to store information, optimization of storage technologies is becoming a key challenge, particularly in tape drives. In magnetic storage systems, data is read from and written onto magnetic recording media utilizing magnetic transducers commonly. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media. An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, magnetic tape is moved over the surface of the tape head at high speed. Usually the tape head is designed to minimize the spacing between the head and the tape. The spacing between the magnetic head and the magnetic tape is crucial so that the recording gaps of the transducers, which are the source of the magnetic recording flux, are in near contact with the tape to effect writing sharp transitions, and so that the read element is in near contact with the tape to provide effective coupling of the magnetic field from the tape to the read element.

Tape drives have conventionally used a servo system to keep the write/read heads in the correct lateral location on the tape. The difference between the correct location and actual location of the heads is referred to as position error signal (PES). Current servo systems implement a fixed threshold such that if the PES is larger than the threshold, the writing of the heads will be stopped to prevent overwriting of adjacent tracks. This threshold is referred to as the stopwrite (SW) threshold. However, it is difficult to pick the appropriate SW threshold due to the differences in distributions of PES data for different drives and/or different tapes. Another drawback is that when a particular predetermined SW threshold is used, the drive may write the data without any apparent error, when actually the adjacent tracks have been overwritten, rendering the data therein unreadable. This result is highly undesirable.

In data storage, error correction coding (ECC) is used to achieve very high data integrity. For example, magnetic tape storage products are designed to ensure bit error rates in the range of 10-17 to 10-20 under normal operating conditions. Linear block codes such as Reed-Solomon (RS) codes and low-density parity-check (LDPC) codes are generally employed in data storage products. In optical and magnetic tape storage, powerful product codes are used to mitigate bad channel conditions that give rise to errors. Product codes allow the construction of very long block codes that are based on short constituent codes. The resulting product code is not the best possible long code for a given dimension and a given length. However, since the code is composed of smaller component block codes, the complexity of decoding product codes becomes manageable in practice.

Scaling tape systems to high areal densities results in a loss in signal to noise ratio of the read back signal that must be compensated by improvements in the head, media and data channel technologies. State-of-the-art linear tape recording systems employ product error-correction codes (ECC) that encode data in two-dimensional arrays, where each row is an (N1,K1) Reed-Solomon (RS) code word referred to as a C1 code word and each column is an (N2,K2) RS code word referred to as a C2 code word.

Uncorrected read errors are managed by microcode recovery algorithms. In order to correct the error, recovery strategies will backhitch and reposition to the failing dataset in order to reread it from tape using a range of speed, dataflow, servo, and channel settings. Other than channel calibrations and optimizations, no other known methods exist to improve dataset error rate. Despite channel signal optimizations and servo control configurations, C1 and C2 correction may not always resolve data in cases of high error rate. Legacy dataflow application-specific integrated circuit (ASIC) decodes a 2-way ECC encoded dataset. After a dataset is read, C1 level correction is used to improve C2 level correction.

Accordingly, in view of the foregoing, the present invention provides various embodiments for dataset error correction in tape storage systems. In one embodiment, in a tape storage system using an iterative hardware decoder, at least one microcode iterative decode cycle is initialized on a buffered dataset, where each iterative decode cycle provides an error feedback loop as will be further described.

Turning now to the Figures, and in particular to FIG. 1A, there is depicted a block diagram of client-server library system 100 for archiving data in which aspects of the present invention may be implemented. The system 100 includes multiple client computers 111 from which data is transmitted to a server 112 for archiving in a data storage library 113. The client computers 111 also retrieve previously archived data from the library 113 through the server 112. Client computers 111 may be personal computers, portable devices (e.g., PDAs), workstations, or server systems, such as the IBM TS7720™. The client computers 111 may be connected to the server 112 through a local area network such as an Ethernet network, or by SCSI, iSCSI, Fibre Channel, Fibre Channel over Ethernet, or Infiniband. Server 112 may again be an IBM TS7740™ server, TS7720™ server, or other servers. Similarly, the data storage library 113 may be connected to the server 112 using a high data rate connection such as an optical or copper fiber channel, SCSI, iSCSI, Ethernet, Fibre Channel over Ethernet or Infiniband.

Figure 1B:
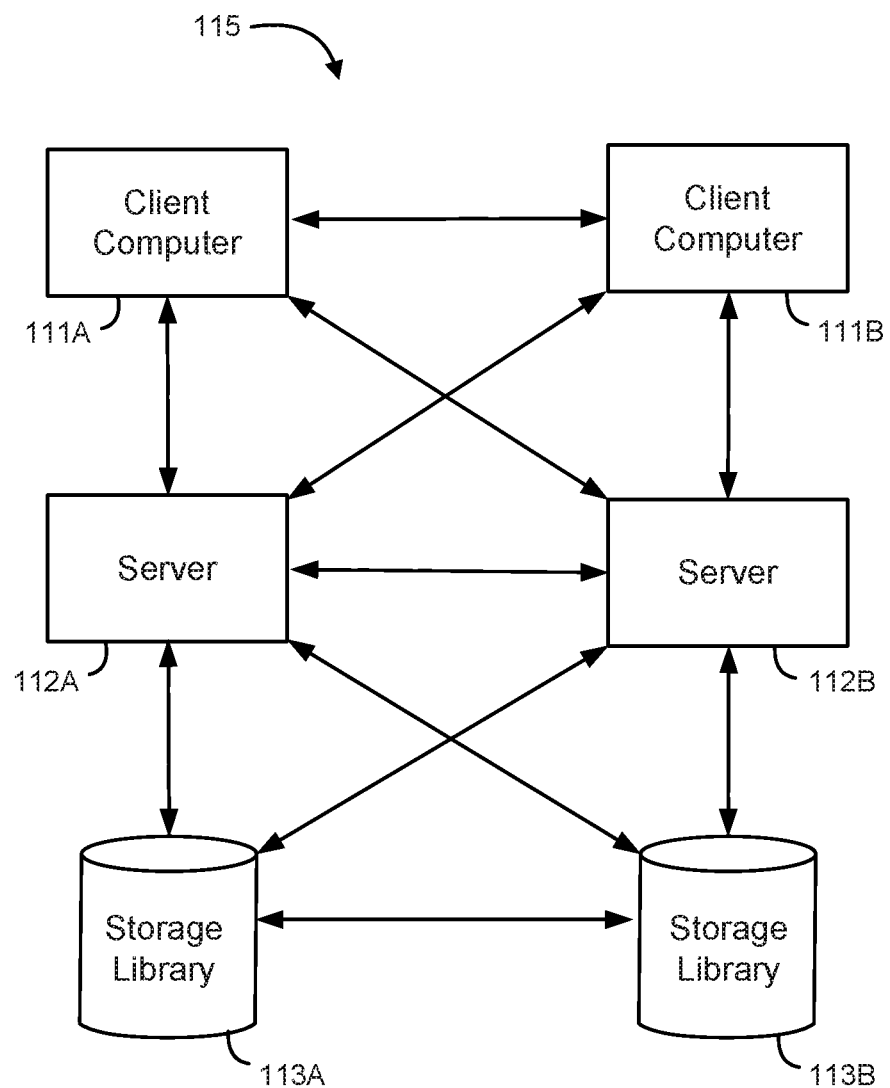
FIG. 1B is a block diagram illustrating a typical grid computing client-server library environment for archiving data in which aspects of the invention can be implemented.

FIG. 1B illustrates a block diagram of a typical grid computing library environment 115 for archiving data. The library environment 115 includes multiple client computers 111A and 111B interconnected to one another and to multiple server systems 112A and 112B. The server systems 112A and 112B are interconnected to one another and to multiple tape libraries 113A and 113B, which are also interconnected to one another.

Figure 2:
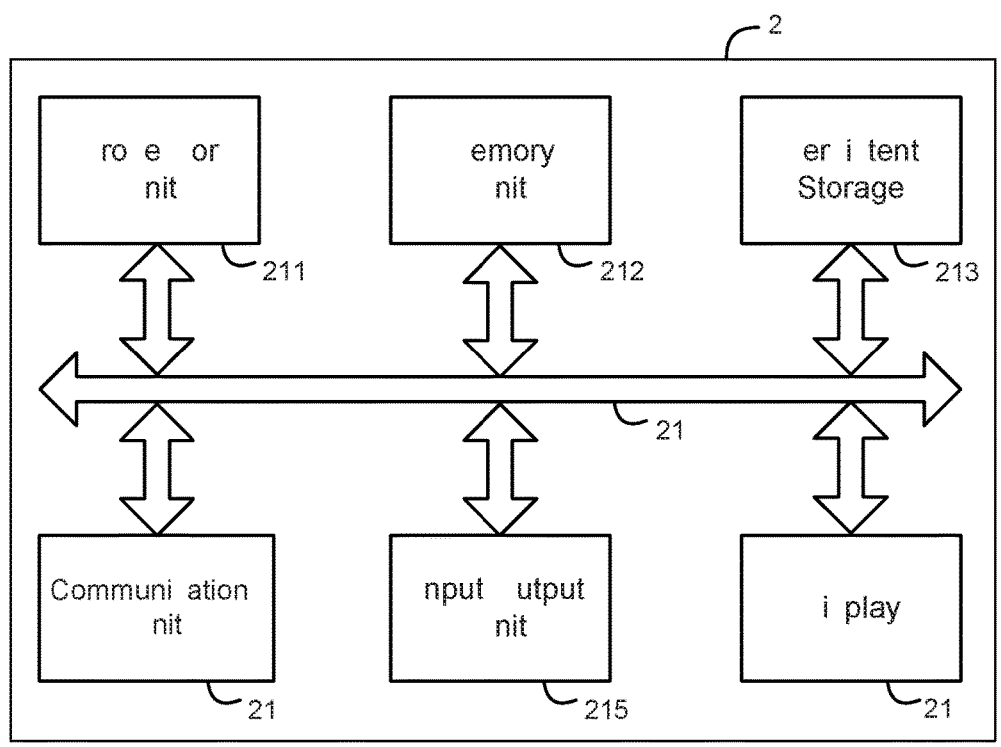
FIG. 2 is a block diagram illustrating a representative computer system which may be used as a client or a server computer.

FIG. 2 illustrates a block diagram of a data processing system that may be used as a client computer 111 or server system 112. As shown, a data processing system 200 includes a processor unit 211, a memory unit 212, a persistent storage 213, a communications unit 214, an input/output unit 215, a display 216 and a system bus 210. Computer programs are typically stored in the persistent storage 213 until they are needed for execution, at which time the programs are brought into the memory unit 212 so that they can be directly accessed by the processor unit 211. The processor unit 211 selects a part of memory unit 212 to read and/or write by using an address that the processor 211 gives to memory 212 along with a request to read and/or write. Usually, the reading and interpretation of an encoded instruction at an address causes the processor 211 to fetch a subsequent instruction, either at a subsequent address or some other address. The processor unit 211, memory unit 212, persistent storage 213, communications unit 214, input/output unit 215, and display 216 interface with each other through the system bus 210.

Figure 3:
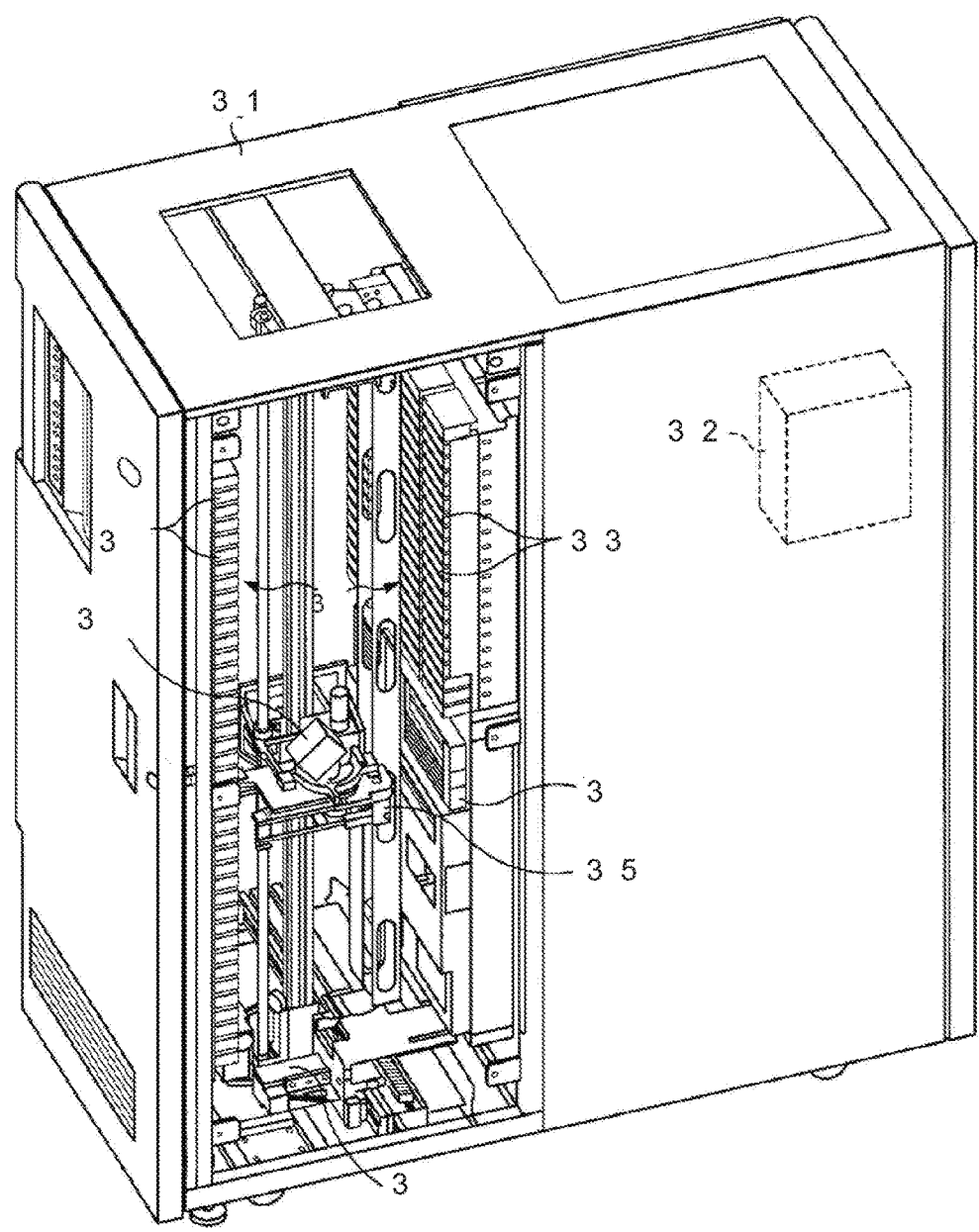
FIG. 3 illustrates a typical data storage tape library for archiving data in which aspects of the present invention may be implemented upon.

FIG. 3 illustrates an example of a data storage library 301 which may be found in an environment of an implementation of the present invention. The library 301 is an automated tape library that accommodates multiple tape drives 304 for reading and writing on tape media, such as single-reel or two-reel magnetic tape cartridges. Examples of the library 301 include IBM TS3400™ and TS3500™ Tape Libraries, IBM Total Storage™ 3494 Tape Libraries, and IBM 3952™ Tape Frames Model C20, which store magnetic tape cartridges and use IBM TS1130™ tape drives. Other examples of the library 301 include IBM TS3310™ and TS3100/3200™ tape libraries which store magnetic tape cartridges and use IBM LTO (Linear Tape Open) tape drives. A plurality of tape media 303 are stored in banks or groups of storage slots 309. Tape media may encompass a variety of media, such as that contained in magnetic tape cartridges, magnetic tape cassettes, and optical tape cartridges, in various formats. For universal reference to any of these types of media, the terms "tape media" or "media" are used herein, and any of these types of containers are referred to as "tape cartridges" or "cartridges" herein. An access robot 306, including a cartridge picker 305 and a bar code reader 308 mounted on the picker, transports a selected cartridge 303 between a storage slot 309 and a drive 304.

The library 301 further has a library controller 302 which includes at least one microprocessor. The library controller 302 may serve to provide an inventory of the cartridges 303 and to control the library 301. Typically, the library controller 302 has suitable memory and data storage capability to control the operation of the library 301. The library controller 302 controls the actions of the access robot 306, cartridge picker 305, and bar code reader 308. The library controller 302 is interconnected through an interface to one or more host processors, which provides commands requesting access to particular tape media or to media in particular storage slots. A host, either directly, or through the library controller, controls the actions of the data storage drives 304. Commands for accessing data or locations on the tape media and information to be recorded on, or to be read from, selected tape media are transmitted between the drives 304 and the host. The library controller 302 is typically provided with a database for locating the tape cartridges 303 in the appropriate storage slots 309 and for maintaining the cartridge inventory.

Figure 4:
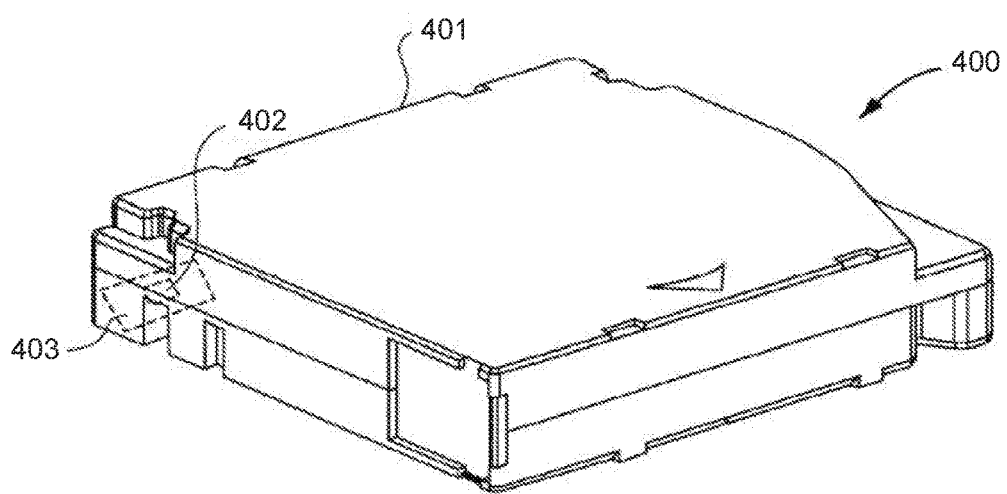
FIG. 4 illustrates an example of a tape cartridge media for use in the data storage tape library in FIG. 3.

FIG. 4 illustrates a perspective view of an exemplary tape cartridge 400 for use in a tape drive system 304 of FIG. 3, and fundamental to the present invention. The tape cartridge 400 has a reel (not shown) for holding tape media (not shown) which is wound around the reel hub. The tape cartridge 400 further includes an RFID cartridge memory 402 which is on printed circuit board 403, for wireless interfacing with the tape drive 304 and the cartridge picker 305. The tape cartridge 400 is referred to as a single-reel cartridge as it includes only one tape reel which acts as a supply reel during operation. A take-up reel is provided in the tape drive 304 for receiving the tape media when the tape media is being unspooled from the tape reel. In a different design of the tape drive 304, a take-up reel might be included in the cartridge 400 itself rather than in the tape drive 304. Such a tape cartridge is referred to as a dual-reel cartridge.

Figure 5:
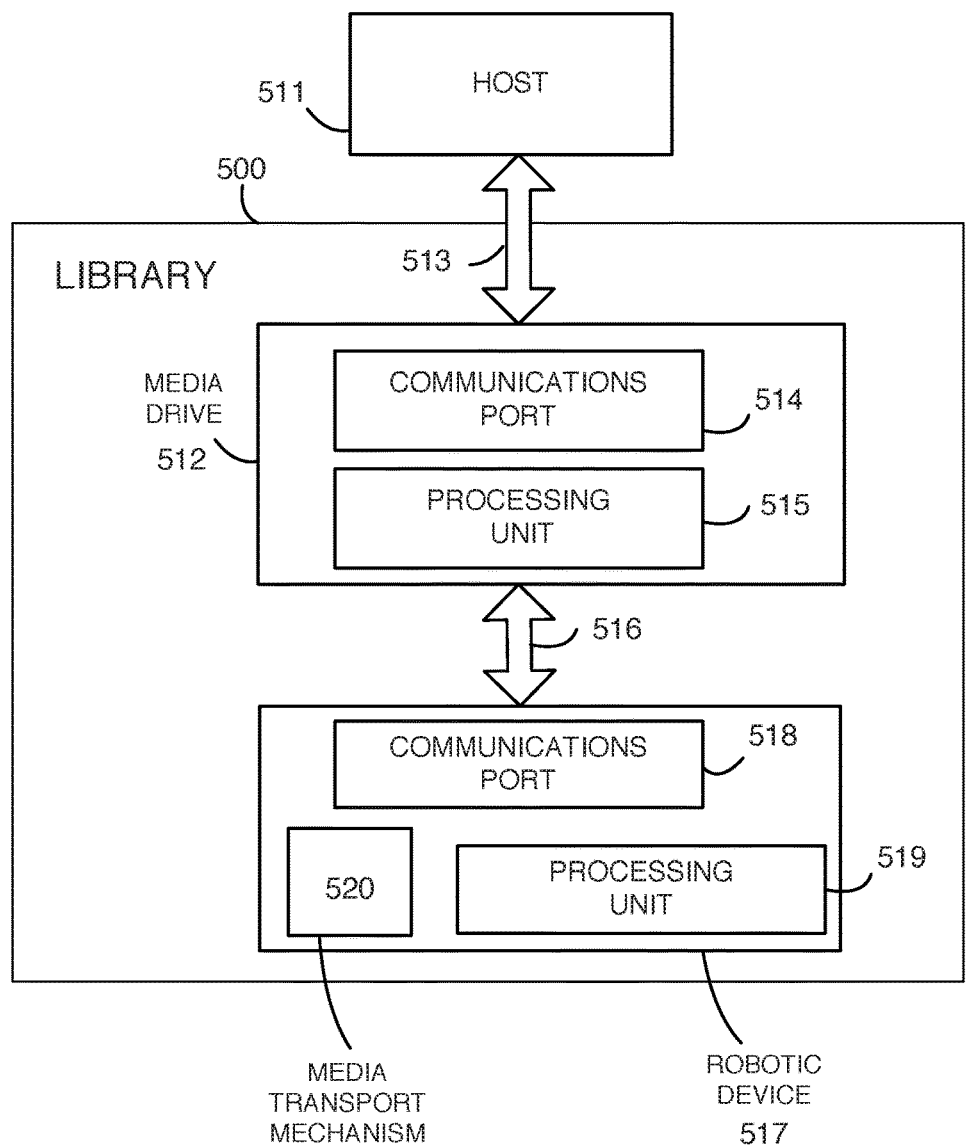
FIG. 5 illustrates a block diagram showing an exemplary data storage tape library in communication with a host computer for providing aspects of the invention.

FIG. 5 is a block diagram showing the functional components of an exemplary data storage tape library 500 in communication with a host computer 511 for providing aspects of the invention. The library 500 is attached to a host 511, and includes a media drive 512 and a robotic device 517. Data and control path 513 interconnects the host 511 and drive 512. Similarly, data and control path 516 interconnects the drive 512 and the robotic device 517. The paths 513 and 516 may comprise suitable means for conveying signals, such as a bus with one or more conductive members (such as wires, conductive traces, cables, etc.), wireless communications (such as radio frequency or other electromagnetic signals, infrared communications, etc.), and fiber optic communications. Furthermore, the paths 513 and 516 may employ serial, parallel, or another communications format, using digital or analog signals as desired. Communications with the media drive 512 and robotic device 517 are through communications ports 514 and 518, respectively.

Both the drive 512 and the robotic device 517 include respective processing units 515 and 519. The library 500 manages the positioning and access of removable or portable data storage media such as magnetic tape, cartridge 400, optical tape, optical disk, removable magnetic disk drive, CD-ROM, digital video disk (DVD), flash memory, or another appropriate format. Some of these types of storage media may be self-contained within a portable container, or cartridge. For universal reference to any of these types of storage media, this disclosure refers to them as media.

The host 511 may be a server, workstation, personal computer, or other means for exchanging data and control signals with the media drive 512. The drive 512 comprises a machine for reading data from and/or writing data to exchanging data with a portable data storage media. The robotic device 517 includes the processing unit 519 and a media transport mechanism 520 coupled to processing unit 519. The media transport mechanism 520 includes servos, motors, arms, grippers, sensors and other robotic, mechanical and electrical equipment to perform functions that include (at least) the transportation of media items between the drive 512, various storage bins (not shown), import/export slots, etc. The mechanism 520 may, for example, comprise an auto-loader mounted to the drive 512, a robotic arm housed inside a mass storage library, or another suitable device. As an example, the mechanism 520 may comprise an access robot 306, cartridge picker 305 and bar code reader 308 from FIG. 3.

Figure 6:
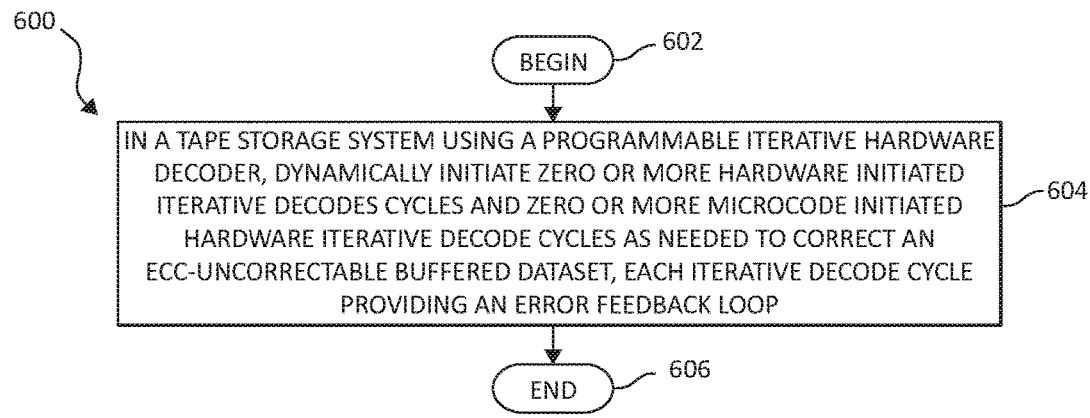
FIG. 6 illustrates a flow chart of a method for data error recovery in tape storage systems according to aspects of the present invention.

Continuing to FIG. 6, a flow chart diagram illustrating an exemplary method 600 for data error recovery in a tape storage system, among other aspects of the illustrated embodiments, is depicted. As aforementioned the method 600 may be performed in accordance with the present invention in any of the environments depicted in FIGS. 1-5, among others, in various embodiments. Of course, more or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

Beginning (step 602), in a tape storage system using an iterative hardware decoder, at least one microcode iterative decode cycle is dynamically initialized on a buffered dataset, where each iterative decode cycle providing an error feedback loop (step 604). The method ends (606).

Figure 7:
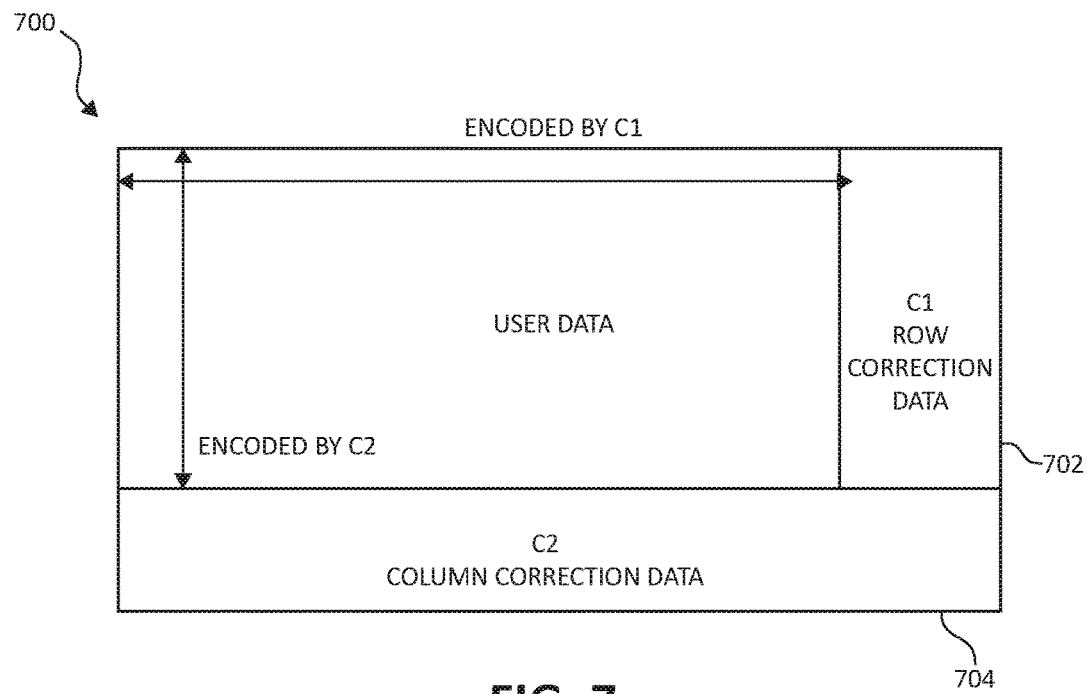
FIG. 7 illustrates a block diagram of a 2-way error correction encoding (ECC) encoded data sub-dataset according to aspects of the present invention.

FIG. 7 illustrates a block diagram of a 2-way error correction encoding (ECC) encoded data sub-dataset 700. Each 2-way ECC encoded sub-dataset has m-rows 702 and n-columns 704 of 4-way interleaved code words. C1 correction is the first level of encoding based on sub-dataset row-processing, and C2 correction is the second level of encoding based on sub-dataset column processing.

Microcode iterative decoding enables the dataflow to perform multiple C2-C1 decode iterations over a dataset already resident in a data buffer. In this way, no reread of data is required to improve dataset decode results. Microcode iterative decode cycles may be performed while tape is at speed (the drive is still in motion) or performed once motion has stopped and the drive has repositioned back to the dataset in error. Each microcode iterative decode cycle builds on the correction improvement of a previous cycle.

Either the dataset in the buffer becomes correctable or a correction status converges to a "no improvement" state and/or exceeds a predetermined error correction threshold limit. If still uncorrectable, microcode recovery algorithms proceed to reread data from tape.

This repeated, or iterative, decode may be performed by dataflow logic a limited number of times while tape is moving before data buffer throughput and host performance are affected. Once beyond such a threshold, tape motion must stop and a dataset will enter into data recovery under microcode control. For example, n number of microcode iterative decode cycles may be initiated before stopping the tape due to buffering. Following a backhitch, further iterative decode action by microcode may continue in order to improve dataset correction as much as feasible. For example, x number of microcode iterative decode cycles may be initiated while the tape is stopped, until it is determined there is no longer any correction improvement, and/or a predetermined error correction threshold is reached. Microcode iterative decode operates on a dataset image that is stored in DRAM, so no reread is involved. If the dataset is able to be corrected with further invocations of iterative decode by microcode, it significantly reduces head wear and possible tape damage involved with multiple backhitches required to reread data from tape.

The advantages to this recovery strategy are the ability to do limited number of iterative decodes that do not impact performance while tape is still moving, flexibility for any number of iterations once the tape motion has stopped, and less head and media wear associated with excessive backhitch and reread attempts from tape.

In one embodiment, microcode iterative decode is a dataflow feature that may be optionally enabled during dataflow decode of an ECC encoded dataset read from tape.

Figure 8A:
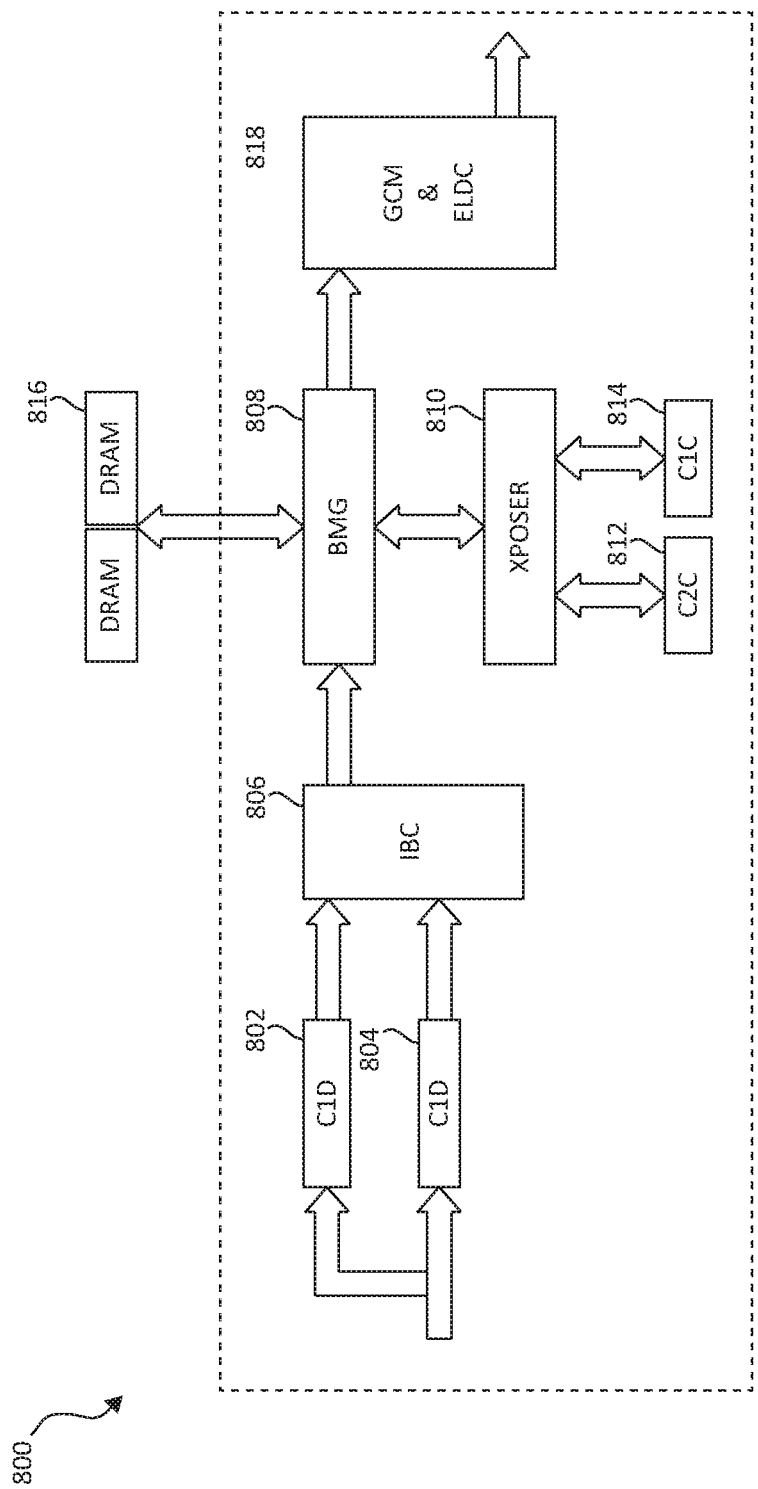
FIG. 8 illustrates block diagram of a read data path under a linear tape-open (LTO) 8 IBM® CWI-4 (BARA) format according to aspects of the present invention.
Figure 8C:
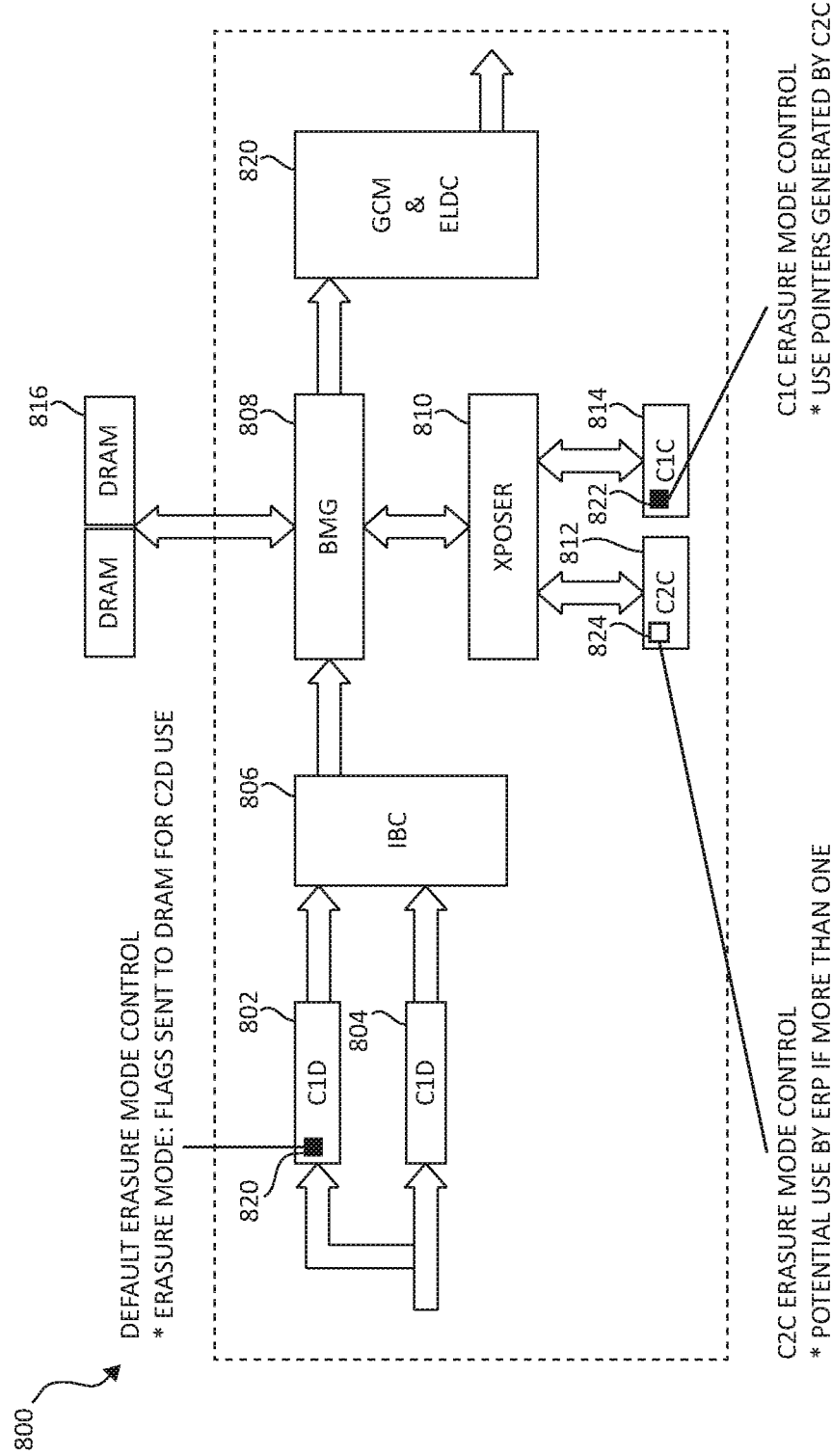

FIG. 8 illustrates block diagram of a read data path 800 under a linear tape-open (LTO) 8 IBM® CWI-4 (BARA) format. Depicted are a Code-1 Decoder (C1D) 802, Read De-Formatter (RFMT) 804, Interleaved Block Controller (IBC) 806, Buffer Manager (BMG) 808, Interposer (Xposer) 810, Code-2 Controller (C2C) 812, Code-1 Controller (C1C) 814, Dynamic Random-Access Memory (DRAM) 816, and Galois Counter Mode (GCM) and Embedded Lossless Data Compression (ELDC) 818 for managing the dataflow of the dataset.

In one embodiment, the dataflow uses the erasure mode control configured in the CM 802 block to determine if C1 error flags will be stored in the buffer along with data. C1 error flags, status, and data are moved to DRAM 816 where they are then used by the C2C block to perform C2 error correction (the IBC 806 block stores corresponding C1D 802 level correction status for retrieval by microcode). When enabled, the output of the C2C 812 block is automatically fed to C1C 814 block for an iterative decode cycle. Once this is developed, the C1 error flags are updated in DRAM 816. The BMG 808 block accumulates C1C 814 and C2C 812 correction status for retrieval by microcode. If the dataset is not yet correctable, and if so enabled, the dataflow or microcode will then initiate another C2-C1 iterative decode cycle. This may be the normal limitation at which an error condition is posted and tape motion stopped for microcode error recovery, but is not constrained to be.

In other embodiments, in dataflow implementations where more inline iterative decode is desired, the read dataflow may expand symmetrically with the addition of additional C2C 812 and C1C 814 blocks, which are dedicated to sequencing iterative decode cycles. The BMG 808 block will hold unique correction status for each C2C 812 and C1C 814 block for retrieval by microcode. Example implementation options for iterative decode cycles performed inline by dataflow include, but are not limited to:
 C2 only (Legacy mode, no iterative decode);
 C2-C1 iterative decode;
 C2-C1-C2 iterative decode; and
 C2-C1-C2-C1 iterative decode.

In some embodiments, the Xposer 810 block controls dataflow usage of iterative decode. When read recovery is initiated by microcode, new recovery behavior will be gated by this status. If an XP mode is disabled in the dataflow, then legacy correction mode is used in the drive, and use of the highest drive speeds is disabled for both normal and recovery microcode. If an XP mode is enabled and iterative decode is enabled, then the dataflow will initiate one or more decode iterations at speed for every sub-dataset and microcode is capable of invoking iterative decode as a recovery mechanism. The scope of the iteration is defined by dataflow implementation.

Read microcode error recovery focuses on correction of an uncorrectable dataset read from tape. Each dataset is associated with one buffer segment, so a dataset may be identified by buffer segment number. Example microcode iterative decode actions are as follows:

Once data is read into the buffer from tape and while tape is still moving, the dataflow performs one or more hardware iterative decode cycles against the buffered dataset at speed without microcode intervention.

At slow speeds, microcode may initiate one or more iterative decode cycles while tape is still moving. This recovery action depends on a measured impact to host performance and code complexity.

In order to continue or initiate microcode error recovery, the drive will be stopped and a backhitch-reposition will occur.

Following reposition, microcode will read status registers from the IBC 806 and BMG 808 blocks. The BMG 808 block will rollup a decode status for each C1C 814 and C2C 812 block, including a sub-dataset uncorrectable error status (UE) and an accumulated correction count (CORCNT). Microcode will monitor this status between any iterative decode request to see if correction is continuing to improve or if correction is converging to "no improvement". This convergence metric will be used by microcode to cease use of any further iterative decode and to then reread data from tape. Status indicators may be, for example:
 ID CYCLE STATUS #1: C2C: UE=1 and CORCNT=500
 C1C: UE=1 and CORCNT=200 Progressing (continue);
 ID CYCLE STATUS #2: C2C UE=1 and CORCNT=120
 C1C: UE=1 and CORCNT=10 Progressing (continue); and
 ID CYCLE STATUS #3: C2C: UE=1 and CORCNT=0
 C1C: UE=1 and CORCNT=0 (This means that sub-datasets are still in error, but no progress is being made—STOP ID requests).

Convergence metrics will vary, of course, depending on dataflow implementation and how much iterative decode C1C-C2C status is monitored by the microcode.

If the dataset becomes correctable following one or more iterative decode requests, then recovery will terminate successfully without any reread of data from tape. Otherwise, once iterative decode requests have converged to a stopping point and the dataset is still uncorrectable, then microcode will reread DS #n from tape with altered read configuration characteristics, such as variations of dataflow, servo, channel, speed and repositioning options.

Figure 9C:
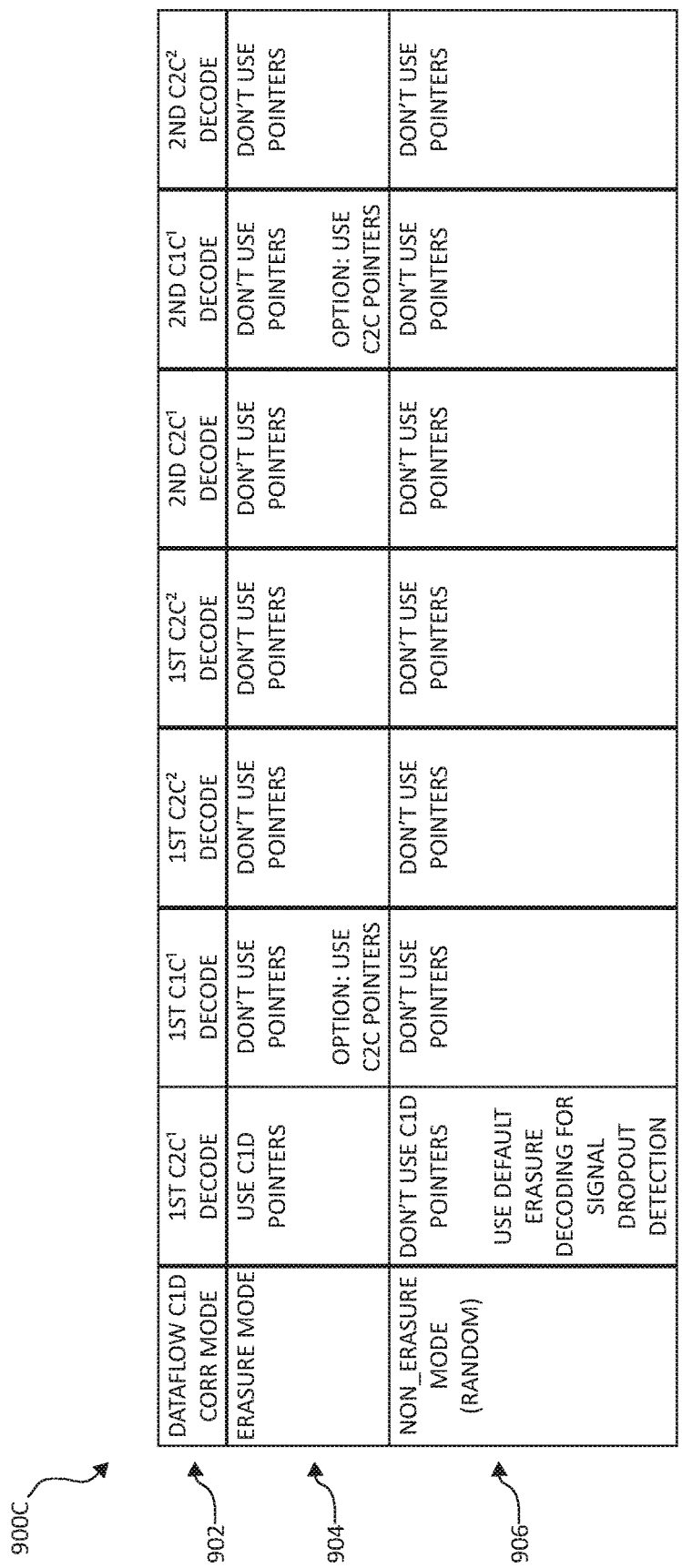
FIG. 9C illustrates a continuation of the table set of exemplary erasure correction configuration settings shown in FIG. 9B according to aspects of the present invention.

In other embodiments, recovery options available to microcode recovery on reread attempts is to alter Erasure Control settings, as illustrated in FIGS. 9A, 9B, and 9C. The C1D 802 controls the read correction mode as data is read from tape, and has two settings: Erasure mode, where error flags are generated for use by C2; and non-Erasure mode, for use in cases where decoding errors are likely to be more random than systematic. Default operation assumes random errors, however, the mode is changeable. The C2C 812 and C1C 814 blocks may also contain erasure control settings. In one embodiment, the C2C 812 Erasure control may provide a learned ERP-override on a second or higher iterative decode request. A first C2C 812 pass uses error flags from generated by the IBC 806 or for dropout detection by default. Therefore, the C1C 814 Erasure control may use the pointers generated by C2C 812, but optimally, feedback of inferred dead track information from the read channel may better optimize C1C 814 erasure.

FIGS. 9A, 9B, and 9C illustrate a table set of example erasure correction configuration settings for microcode to configure prior to rereading data from tape. Illustrated are: table 900 showing an inline C2-C1 iteration dataflow, table 900A showing an inline C2-C1-C1 iteration dataflow, and table 900B showing an inline C2-C1-C1-C2 iteration dataflow.

The default C1D 802 read correction mode (erasure vs random) is toggled as a recovery option, with C2C 812 and C1C 814 erasure correction changes for subsequent iterative decode requests. Each of the tables 900, 900A, and 900B identifies 3 iterative Decode requests as columns. Rows follow the CM 802 erasure correction mode set prior to reading data from tape. Each table corresponds to a dataflow implementation defined by scope of iterative decode. Each implemented C2C 812 and C1C 814 block has a superscript notation to identify a unique block (e.g. a first pair are C2C$^1$ and C1C$^1$, a second pair are C2C$^2$ and C1C$^2$, etc.). In other words, column 902 illustrates the unique block and iteration number, column 904 illustrates configuration settings for erasure mode for each corresponding iteration of the iterative decode cycle, and column 906 illustrates configuration settings for non-erasure mode (random errors) for each corresponding iteration of the iterative decode cycle.

In some embodiments, in order to monitor iterative decode performance performed by both dataflow and by microcode, metrics will be added as new Log Page counters and as Tape Map data. These metrics are tailored to the C2-C1 iterative decode implementation and are subject to change with extended iterative decode implementations (e.g. C2-C1-C2). In this way, the effectiveness and depth of Iterative Decoding required by both dataflow and by microcode recovery may be monitored and/or tracked.

Counters may be incremented on invocation by dataflow or microcode, during streaming or following backhitch. The counters are accumulated as mount and lifetime history for internal SARS or host level use, and may include:

Total iterative decode repeat (cycle) count;
Total count of "successful decode by C2C";
Total count of "successful decode by C1C";
Total count of "unsuccessful decode by C2C"; and/or
Total count of "unsuccessful decode by C1C".

Figure 10:
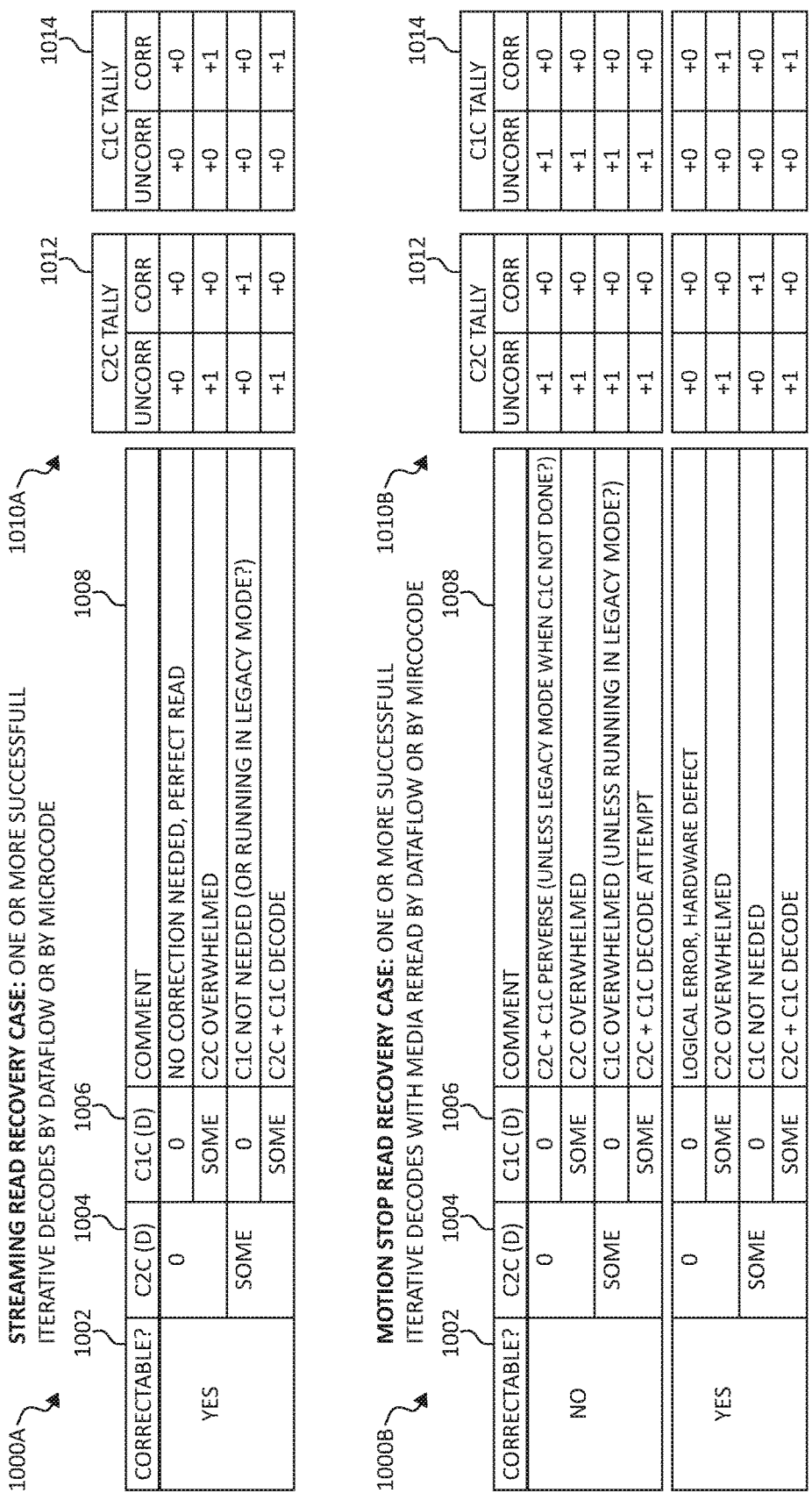
FIG. 10 illustrates a table set of exemplary log counter statistics for microcode iterative decoding according to aspects of the present invention.

FIG. 10 illustrates a table set of example log counter statistics for iterative decoding depicting the aforementioned concept. Illustrated is table 1000A showing statistical comments and corresponding tally table 1010A for iterative decode performed during a streaming read (drive in motion), and table 1000B showing statistical comments and corresponding tally table 1010B for iterative decode performed while the drive is stopped.

Tables 1000A and 1000B illustrate counter methodology for correctable data 1002, C2C decode 1004, C1C decode 1006, and comments 1008. Further, tables 1010A and 1010B illustrate C2C tally column 1012 and C1C tally column 1014. Tally's are kept and accumulated for correctable and uncorrectable data in columns 1012 and 1014.

In some embodiments, a Tape Map Histogram of an indication of successful iterative C2-C1 decodes per dataset per region is kept. Tape Map data pertains to a current mount only. Whereas the aforementioned Log Counters are strictly numeric, the Tape Map is positional in nature, such that iterative decode usage and performance may be viewed together with status and error information logged by multiple functional areas at the same time and location on tape. Sample Tape Map Histogram data may include:

Bucket 1: Baseline status (legacy decode). #DS with one successful C2 correction by dataflow while tape in motion;

Bucket 2: #DS with successful iterative decode beyond first C2 correction while tape in motion (initiated by dataflow or microcode);

Bucket 3: #DS with successful iterative decode following one backhitch (initiated by microcode or dataflow);

Bucket 4: #DS with successful iterative decode following two or more backhitches (successful, initiated by dataflow or microcode); and/or Bucket 5: #DS which could not be corrected with iterative C2-C1 decodes.

Figure 11:
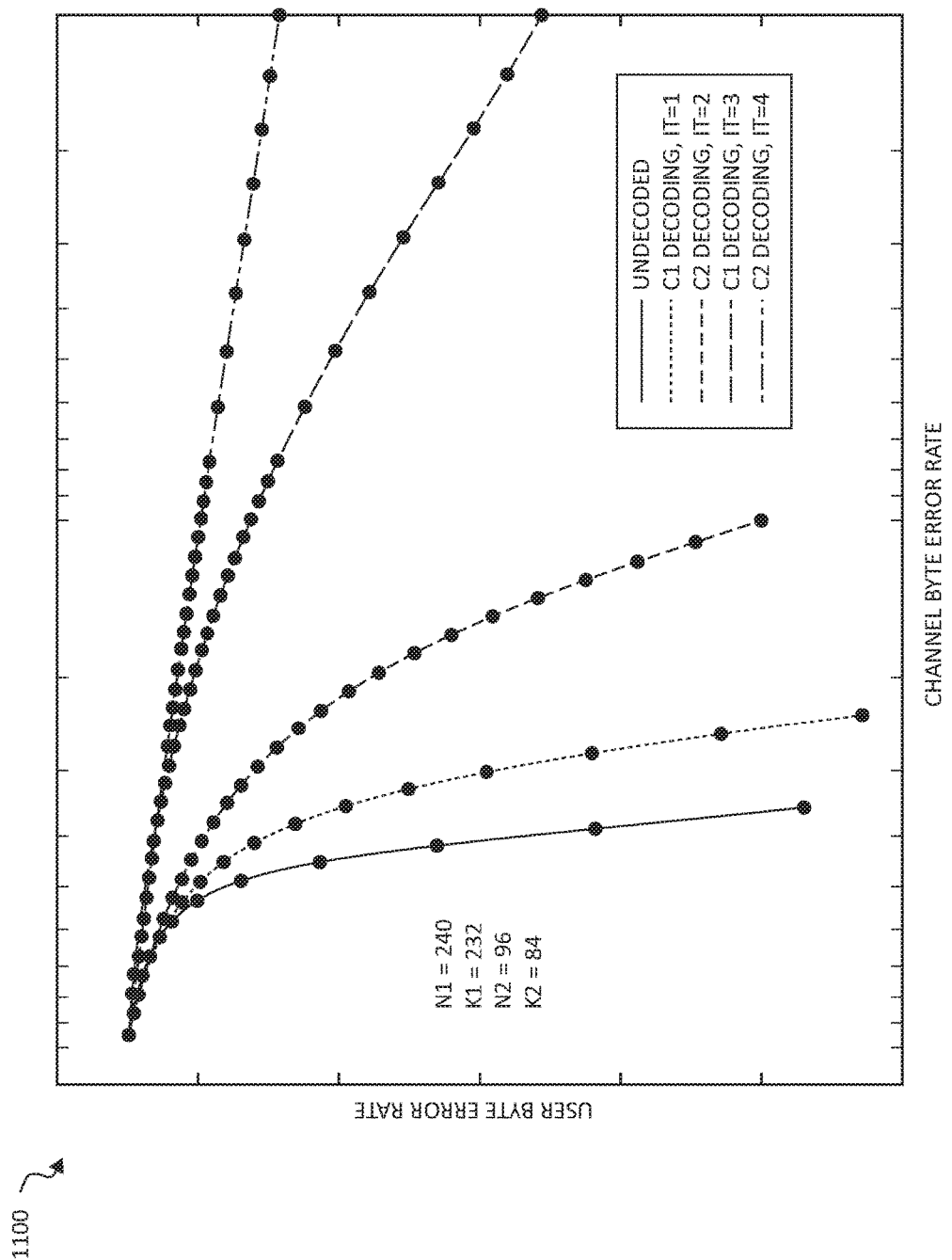
FIG. 11 illustrates a graph depicting C1-C2 iterative decode improvement over multiple iterations, according to aspects of the present invention.

Continuing to FIG. 11, a graph 1100 depicting C1-C2 iterative decode improvement over multiple iterations is illustrated, detailing the advantages of the present invention. Shown is a user byte error rate depicted on the Y-axis and a channel byte error rate depicted on the X-axis. Results of evaluating the performance of the iterative decode scheme for a product code with parameters N1=240, K1=232 and N2=96, K2=84 is exhibited. As indicated in graph 1100, a user byte-error rate dramatically decreases over each iterative decode cycle (iteration 1, iteration 2, etc.).

Figure 12:
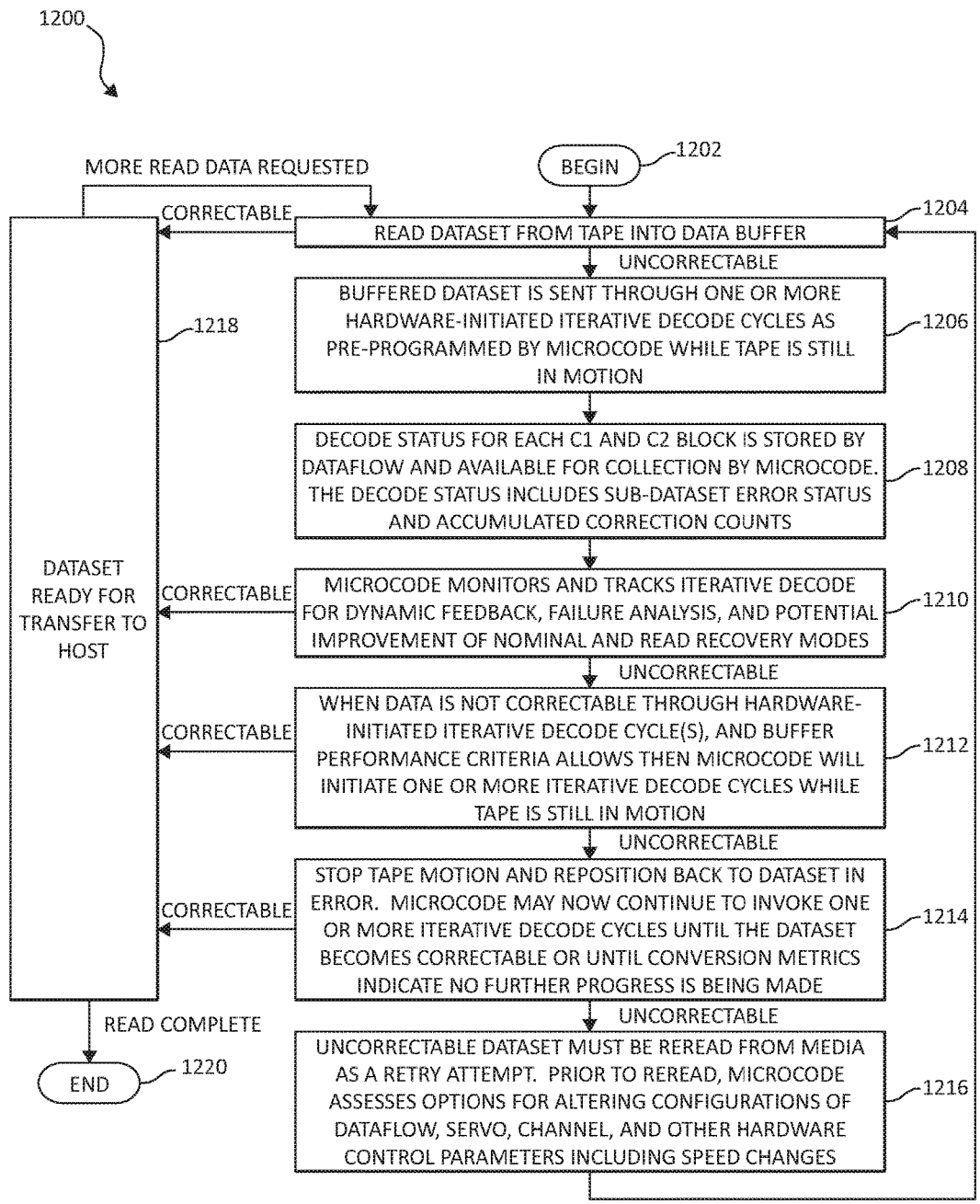
FIG. 12 illustrates an additional flow chart of a method for data error recovery in tape storage systems according to aspects of the present invention.

FIG. 12 illustrates an additional flow chart of a method 1200 for data error recovery in tape storage systems in review of the aforementioned. As aforementioned the method 1200 may be performed in accordance with the present invention in any of the environments depicted in FIGS. 1-5, among others, in various embodiments. Of course, more or less operations than those specifically described in FIG. 12 may be included in method 1200, as would be understood by one of skill in the art upon reading the present descriptions.

Each of the steps of the method 1200 may be performed by any suitable component of the operating environment. For example, in various embodiments, the method 1200 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 1200. Illustrative processors include, but are not limited to, a central processing unit (CPU), an application specific integrated circuit (ASIC), a field programmable gate array (FPGA), etc., combinations thereof, or any other suitable computing device known in the art.

Beginning (step 1202), a buffered dataset is sent through a hardware-initiated iterative decode cycle (step 1204). When data is not recovered through the hardware-initiated iterative decode cycle, one or more iterative microcode decode cycle(s) are then initiated at speed or with tape stopped (1206). The one or more iterative microcode decode cycle(s) provide an error feedback loop of C1C2 block correction, using configuration changes for a next read retry (step 1208). A decode status for each C1 and C2 block is provided, including a sub-dataset error status and accumulated correction count (step 1210). If data is still uncorrectable, microcode rereads the dataset with options of altering data flow configurations, speed, and other configuration changes (step 1212). The microcode monitors and tracks iterative decode for dynamic feedback, failure analysis, and potential improvement of nominal and read recovery modes (step 1214). The method ends (step 1216).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for data error recovery in a tape storage system, by a processor device, comprising:
   in a tape storage system using an iterative hardware decoder, dynamically initializing at least one microcode iterative decode cycle on a buffered dataset, each iterative decode cycle providing an error feedback loop;
   initiating n microcode iterative decode cycles on the buffered dataset while tape is at speed; wherein n comprises a number of microcode iterative decode cycles able to complete without stopping the tape due to buffering; and
   initiating x microcode iterative decode cycles on the buffered dataset while the tape is stopped; wherein x comprises at least one of a plurality of the microcode iterative decode cycles.

2. The method of claim 1, further including initializing the at least one microcode iterative decode cycle on the buffered dataset when an uncorrectable read error occurs.

3. The method of claim 1, wherein providing an error feedback loop comprises, for a next microcode iterative decode cycle, building upon data corrections obtained in a previous microcode iterative decode cycle.

4. The method of claim 1, further including initiating the x microcode iterative decode cycles on the buffered dataset until a predetermined error correction threshold is reached.

5. The method of claim 4, further including, upon reaching the predetermined error correction threshold, rereading data of the buffered dataset from the tape following a backhitch reposition.

6. The method of claim 5, further including, upon rereading the data of the buffered dataset from the tape, changing at least one of a plurality of read configuration characteristics.

7. The method of claim 6, further including monitoring and tracking at least one of a sub-dataset uncorrectable error status (UE) and an accumulated correction count (CORCNT) of attempted error corrections.

8. The method of claim 1, further including maintaining at least one of a log counter and a tape map histogram of successful and unsuccessful attempts of the at least one microcode iterative decode cycle.

9. A system for data error recovery in a tape storage system, comprising:
   at least one processor device, wherein the at least one processor device:
      in a tape storage system using an iterative hardware decoder, dynamically initializes at least one microcode iterative decode cycle on a buffered dataset, each iterative decode cycle providing an error feedback loop,
      initiates n microcode iterative decode cycles on the buffered dataset while tape is at speed; wherein n comprises a number of microcode iterative decode cycles able to complete without stopping the tape due to buffering, and
      initiates x microcode iterative decode cycles on the buffered dataset while the tape is stopped; wherein x comprises at least one of a plurality of the microcode iterative decode cycles.

10. The system of claim 9, wherein the at least one processor device initializes the at least one microcode iterative decode cycle on the buffered dataset when an uncorrectable read error occurs.

11. The system of claim 9, wherein pursuant to providing an error feedback loop, the at least one processor device builds upon data corrections obtained in a previous microcode iterative decode cycle for a next microcode iterative decode cycle.

12. The system of claim 9, wherein the at least one processor device initiates the x microcode iterative decode cycles on the buffered dataset until a predetermined error correction threshold is reached.

13. The system of claim 12, wherein the at least one processor device, upon reaching the predetermined error correction threshold, rereads data of the buffered dataset from the tape following a backhitch reposition.

14. The system of claim 13, wherein the at least one processor device, upon rereading the data of the buffered dataset from the tape, changes at least one of a plurality of read configuration characteristics.

15. The system of claim 14, wherein the at least one processor device monitors and tracks at least one of a sub-dataset uncorrectable error status (UE) and an accumulated correction count (CORCNT) of attempted error corrections.

16. The system of claim 9, wherein the at least one processor device maintains at least one of a log counter and a tape map histogram of successful and unsuccessful attempts of the at least one microcode iterative decode cycle.

17. A computer program product for data error recovery in a tape storage system by at least one processor device, the computer program product embodied on a non-transitory computer-readable storage medium having computer-readable program code portions stored therein, the computer-readable program code portions comprising:
   an executable portion that, in a tape storage system using an iterative hardware decoder, dynamically initializes at least one microcode iterative decode cycle on a buffered dataset, each iterative decode cycle providing an error feedback loop;
   an executable portion that initiates n microcode iterative decode cycles on the buffered dataset while tape is at speed; wherein n comprises a number of microcode iterative decode cycles able to complete without stopping the tape due to buffering; and
   an executable portion that initiates x microcode iterative decode cycles on the buffered dataset while the tape is stopped; wherein x comprises at least one of a plurality of the microcode iterative decode cycles.

18. The computer program product of claim 17, further comprising an executable portion that initializes the at least one microcode iterative decode cycle on the buffered dataset when an uncorrectable read error occurs.

19. The computer program product of claim 17, pursuant to providing an error feedback loop, further comprises an executable portion that builds upon data corrections obtained in a previous microcode iterative decode cycle for a next microcode iterative decode cycle.

20. The computer program product of claim 17, further comprising an executable portion that initiates the x microcode iterative decode cycles on the buffered dataset until a predetermined error correction threshold is reached.

21. The computer program product of claim 20, further comprising an executable portion that, upon reaching the predetermined error correction threshold, rereads data of the buffered dataset from the tape following a backhitch reposition.

22. The computer program product of claim 21, further comprising an executable portion that, upon rereading the data of the buffered dataset from the tape, changes at least one of a plurality of read configuration characteristics.

23. The computer program product of claim 22, further comprising an executable portion that monitors and tracks at least one of a sub-dataset uncorrectable error status (UE) and an accumulated correction count (CORCNT) of attempted error corrections.

24. The computer program product of claim 17, further comprising an executable portion that maintains at least one of a log counter and a tape map histogram of successful and unsuccessful attempts of the at least one microcode iterative decode cycle.

* * * * *